United States Patent
Thibeault et al.

(10) Patent No.: US 6,657,236 B1
(45) Date of Patent: *Dec. 2, 2003

(54) ENHANCED LIGHT EXTRACTION IN LEDS THROUGH THE USE OF INTERNAL AND EXTERNAL OPTICAL ELEMENTS

(75) Inventors: Brian Thibeault, Santa Barbara, CA (US); Michael Mack, Goleta, CA (US); Steven DenBaars, Goleta, CA (US)

(73) Assignee: Cree Lighting Company, Goleta, CA (US)

( * ) Notice: Subject to any disclaimer, the term of this patent is extended or adjusted under 35 U.S.C. 154(b) by 179 days.

This patent is subject to a terminal disclaimer.

(21) Appl. No.: 09/727,803

(22) Filed: Nov. 28, 2000

Related U.S. Application Data

(60) Provisional application No. 60/168,817, filed on Dec. 3, 1999.

(51) Int. Cl.[7] .............................. H01L 33/00
(52) U.S. Cl. .................. 257/98; 257/99; 257/94; 257/95; 257/96; 257/97; 257/81
(58) Field of Search ................ 257/98, 95, 96, 257/97, 99, 81, 94

(56) References Cited

U.S. PATENT DOCUMENTS

| | | | |
|---|---|---|---|
| 3,954,534 A | 5/1976 | Scifres et al. | 156/7 |
| 5,414,281 A | 5/1995 | Watabe et al. | 257/95 |
| 5,491,350 A | 2/1996 | Unno et al. | 257/99 |
| 5,528,057 A | 6/1996 | Yanagase et al. | 257/96 |
| 5,557,115 A * | 9/1996 | Shakuda | 257/81 |
| 5,744,828 A * | 4/1998 | Nozaki et al. | 257/94 |
| 5,779,924 A * | 7/1998 | Krames et al. | 216/24 |
| 5,793,062 A | 8/1998 | Kish et al. | 257/98 |
| 6,091,085 A * | 7/2000 | Lester | 257/98 |
| 6,410,942 B1 * | 6/2002 | Thibeault et al. | 257/88 |

FOREIGN PATENT DOCUMENTS

| | | |
|---|---|---|
| DE | 2633191 A1 | 7/1976 |
| EP | 0977277 A1 | 11/1998 |
| JP | 10-163525 A * | 6/1998 |

(List continued on next page.)

OTHER PUBLICATIONS

Schnitzer et al., "30% External Quantum Efficiency From Surface Textured, Thin Film Light Emitting Diodes", Applied Physics Letters 63, pp. 2174–2176 (1993).
Knock et al., "Strongly Directional Emission From AlGaAs/GaAs Light Dmitting Diodes" Applied Physics Letters 57, pp. 2327–2329 (1990).
Krames et al., "High Power Truncated Inverted Pyramid (AlxGa1–x)o.5ln0.5P/GaP Light Emitting Diodes Exhibiting>50% External Quantum Efficiency", Applied Physics Letters 75, p. 2365–2367 (1999).

(List continued on next page.)

Primary Examiner—Nathan J. Flynn
Assistant Examiner—Remmon R. Fordé
(74) Attorney, Agent, or Firm—Koppel, Jacobs, Patrick & Heybl

(57) ABSTRACT

This invention describes new LEDs having light extraction structures on or within the LED to increase its efficiency. The new light extraction structures provide surfaces for reflecting, refracting or scattering light into directions that are more favorable for the light to escape into the package. The structures can be arrays of light extraction elements or disperser layers. The light extraction elements can have many different shapes and are placed in many locations to increase the efficiency of the LED over conventional LEDs. The disperser layers provide scattering centers for light and can be placed in many locations as well. The new LEDs with arrays of light extraction elements are fabricated with standard processing techniques making them highly manufacturable at costs similar to standard LEDs. The new LEDs with disperser layers are manufactured using new methods and are also highly manufacturable.

36 Claims, 6 Drawing Sheets

FOREIGN PATENT DOCUMENTS

| JP | 11-274568 | 10/1999 |
|----|-----------|---------|
| WO | WO 9953578 | 10/1999 |
| WO | WO 0141225 A2 | 6/2001 |

OTHER PUBLICATIONS

Schnitzer et al., "Ultrahigh Spontaneous Emission Quantum Efficiency, 99.7% Internally and 72% Externally, from AlGaAs/GaAs/AlGaAs Double Heterostructures" Applied Physics Letters 62, p. 131–133 (1993).

Egawa et al. "Stimulated Emission Current Injected InGan/aLgAn Surface Emittingdiode with Al Reflectro at Room Temperature", pp. 486–488, Electronics Letters, Feb. 29, 1996, Vol 32, No. 5.

I. Schnitzer et al. "30% External Quantum Efficiency From Surface Textured, Thin–Film Light–Emitting Diodes" 1993 American Institute of Physics, pp. 2174–2176.

\* cited by examiner

ENHANCED LIGHT EXTRACTION IN LEDS THROUGH THE USE OF INTERNAL AND EXTERNAL OPTICAL ELEMENTS

The following application claims the benefit of provisional application No. 60/168,817 to Thibeault et al., which was filed on Dec. 3, 1999.

This invention was made with Government, support under Contract No. 70NANB8H4022, awarded by the NIST (ATP). The Government has certain rights in this invention.

BACKGROUND OF THE INVENTION

1. Field of the Invention

This invention relates to light emitting diodes and more particularly to new structures for enhancing their light extraction.

2. Description of the Related Art

Light emitting diodes (LEDs) are an important class of solid state devices that convert electric energy to light and commonly comprise an active layer of semiconductor material sandwiched between two oppositely doped layers. When a bias is applied across the doped layers, holes and electrons are injected into the active layer where they recombine to generate light. The light generated by the active region emits in all directions and light escapes the semiconductor chip through all exposed surfaces. Packaging of the LED is commonly used to direct the escaping light into a desired output emission profile.

As semiconductor materials have improved, the efficiency of semiconductor devices has also improved. New LEDs are being made from materials such as InAlGaN, which allows for efficient illumination in the ultra-violet to amber spectrum. Many of the new LEDs are more efficient at converting electrical energy to light compared to conventional lights and they can be more reliable. As LEDs improve, they are expected to replace conventional lights in many applications such as traffic signals, outdoor and indoor displays, automobile headlights and taillights, conventional indoor lighting, etc.

However, the efficiency of conventional LEDs is limited by their inability to emit all of the light that is generated by their active layer. When an LED is energized, light emitting from its active layer (in all directions) reaches the emitting surfaces at many different angles. Typical semiconductor materials have a high index of refraction ($n \approx 2.2-3.8$) compared to ambient air ($n=1.0$) or encapsulating epoxy ($n \approx 1.5$). According to Snell's law, light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

One method of reducing the percentage of TIR light is to create light scattering centers in the form of random texturing on the LED's surface. [Shnitzer, et al., "30% *External Quantum Efficiency From Surface Textured, Thin Film Light Emitting Diodes*", Applied Physics Letters 63, Pgs. 2174–2176 (1993)]. The random texturing is patterned into the surface by using sub micron diameter polystyrene spheres on the LED surface as a mask during reactive ion etching. The textured surface has features on the order of the wavelength of light that refract and reflect light in a manner not predicted by Snell's law due to random interference effects. This approach has been shown to improve emission efficiency by 9 to 30%.

One disadvantage of surface texturing is that it can prevent effective current spreading in LEDs which have a poor electrical conductivity for the textured electrode layer, such as for p-type GaN. In smaller devices or devices with good electrical conductivity, current from the p and n-type layer contacts will spread throughout the respective layers. With larger devices or devices made from materials having poor electrical conductivity, the current cannot spread from the contacts throughout the layer. As a result, part of the active layer will not experience the current and will not emit light. To create uniform current injection across the diode area, a spreading layer of conductive material can be deposited on the surface. However, this spreading layer often needs to be optically transparent so that light can transmit through the layer. When a random surface structure is introduced on the LED surface, an effectively thin and optically transparent current spreader cannot easily be deposited.

Another method of increasing light extraction from an LED is to include a periodic patterning of the emitting surface or internal interfaces which redirects the light from its internally trapped angle to defined modes determined by the shape and period of the surface. See U.S. Pat. No. 5,779,924 to Krames et at. This technique is a special case of a randomly textured surface in which the interference effect is no longer random and the surface couples light into particular modes or directions. One disadvantage of this approach is that the structure can be difficult to manufacture because the surface shape and pattern must be uniform and very small, on the order of a single wavelength of the LED's light. This pattern can also present difficulties in depositing an optically transparent current spreading layer as described above.

An increase in light extraction has also been realized by shaping the LED's emitting surface into a hemisphere with an emitting layer at the center. While this structure increases the amount of emitted light, its fabrication is difficult. U.S. Pat. No. 3,954,534 to Scifres and Burnham discloses a method of forming an array of LEDs with a respective hemisphere above each of the LEDs. The hemispheres are formed in a substrate and a diode array is grown over them. The diode and lens structure is then etched away from the substrate. One disadvantage of this method is that it is limited to formation of the structures at the substrate interface, and the lift off of the structure from the substrate results in increased manufacturing costs. Also, each hemisphere has an emitting layer directly above it, which requires precise manufacturing.

U.S. Pat. No. 5,793,062 discloses a structure for enhancing light extraction from an LED by including optically non-absorbing layers to redirect light away from absorbing regions such as contacts, and also to redirect light toward the LED's surface. One disadvantage of this structure is that the non-absorbing layers require the formation of undercut strait angle layers, which can be difficult to manufacture in many material systems.

Another way to enhance light extraction is to couple photons into surface plasmon modes within a thin film metallic layer on the LED's emitting surface, which are emitted back into radiated modes. [Knock et al., *Strongly Directional Emission From AlGaAs/GaAs Light Emitting Diodes*, Applied Physics Letter 57, Pgs. 2327–2329 (1990)].

These structures rely on the coupling of photons emitted from the semiconductor into surface plasmons in the metallic layer, which are further coupled into photons that are finally extracted. One disadvantage of this device is that it is difficult to manufacture because the periodic structure is a one-dimensional ruled grating with shallow groove depths (<0.1 $\mu$m). Also, the overall external quantum efficiencies are low (1.4–1.5%), likely due to inefficiencies of photon to surface plasmon and surface plasmon-to-ambient photon conversion mechanisms. This structure also presents the same difficulties with a current spreading layer, as described above.

Light extraction can also be improved by angling the LED chip's side surfaces to create an inverted truncated pyramid. The angled surfaces provide the TIR light trapped in the substrate material with an emitting surface [Krames, et. al., *High Power Truncated Inverted Pyramid* $(Al_xGa_{1-x})_{0.5}In_{0.5}P/GaP$ *Light Emitting Diodes Exhibiting>50% External Qauntum Efficiency*, Applied Physics Letters 75 (1999)]. Using this approach external quantum efficiency has been shown to increase by 35% to 50% for the InGaAlP material system. This approach works for devices in which a significant amount of light is trapped in the substrate. For GaN devices grown on sapphire substrates, much of the light is trapped in the GaN film so that angling the LED chip's side surfaces will not provide the desired enhancement.

Still another approach for enhancing light extraction is photon recycling [Shnitzer, et al., *"Ultrahigh Spontaneous Emission Quantum Efficiency, 99.7% Internally and 72% Externally, From AlGaAs/GaAs/AlGaAs Double Heterostructures"*, Applied Physics Letters 62, Pgs. 131–133 (1993)]. This method relies on LEDs having a high efficiency active layer that readily converts electrons and holes to light and vice versa. TIR light reflects off the LED's surface and strikes the active layer, where it is converted back to an electron-hole pair. Because of the high efficiency of the active layer, the electron-hole pair will almost immediately be reconverted to light that is again emitted in random directions. A percentage of the recycled light will strike one of the LEDs emitting surfaces within the critical angle and escape. Light that is reflected back to the active layer goes through the same process again.

One disadvantage of this approach is that it can only be used in LEDs made from materials that have extremely low optical loss and cannot be used in LEDs having an absorbing current spreading layer on the surface.

SUMMARY OF THE INVENTION

The present invention provides new LEDs having light extraction structures that are disposed on an exposed surface or within the LED to increase the probability of light escaping from the LED; thereby increasing the LED's light extraction and overall efficiency. The new LED is easy to manufacture and provides numerous new options and combinations for extracting light.

The new LED generally comprises an LED structure having a p-type layer, an n-type layer, and an active layer between the p-type and n-type layers. The LED structure is sandwiched between a first spreader layer and a second spreader layer. The spreader layers are semiconducting or conducting layers that distribute current across the plane of the device so that current is efficiently injected into the active layer. Light extraction structures are included that are on or within the new LED (or substrate). The structures provide a spatially varying index of refraction and provides surfaces to allow light trapped within the LED to refract or reflect and escape. In most embodiments the LED structure and current spreading layers are grown on a substrate that is adjacent to the first spreader layer, opposite the LED structure. Respective contacts are included on the first and second spreader layers and a bias applied across the contacts causes the LED structure's active layer to emit light. The light extraction structures are preferably disposed in a plane parallel to the LED's layers and substantially cover the area of the LED.

The light extraction structures are preferably either arrays of light extraction elements (LEEs) or disperser layers. In those embodiments having an LEE array on an exposed surface, the array is formed from a material that has a higher index of refraction than the LED's encapsulating material. The LEEs can be shaped using many different methods and provide many different surfaces for otherwise trapped light to escape.

Alternatively, the new LED can have the LEE arrays placed within the LED itself. The internal LEE arrays are also formed to provide a spatially varying index of refraction. The LEE array is formed during the LED growth process and once the array is formed the remaining layers of the LED structure are grown over the array by an epitaxial deposition technique to embed the LEE array within the LED. Light rays that would otherwise be trapped in the epitaxial layers or substrate can interact with the LEE array to refract and/or reflect into rays that can escape the LED.

Another embodiment of the new LED includes a disperser layer on one of the LED's exposed surfaces, with the layer formed of a material having a higher index of refraction than the LED encapsulating material. Light that hits the disperser layer on the LED has an increased chance of being scattered into an escaping direction. By using a surface material to form the light disperser layer the problems of patterning roughness into the semiconductor surface are eliminated, providing an advantage over the work of Schnitzer.

Alternatively, the new LED can have disperser layers disposed within the LED itself. The disperser layer can be formed in or on the substrate prior to epitaxial growth of the LED, or within the LED epitaxial structure itself. The disperser layer is made from a material with an index of refraction that is different from the substrate and/or epitaxial material so that light scattering can occur.

Most of the above embodiments can also be mounted using flip-chip mounting techniques, with the substrate becoming the LEDs primary emitting surface.

These and other further features and advantages of the invention will be apparent to those skilled in the art from the following detailed description, taken together with the accompanying drawings, in which:

DETAILED DESCRIPTION OF THE INVENTION

First Embodiment

Figure 1:
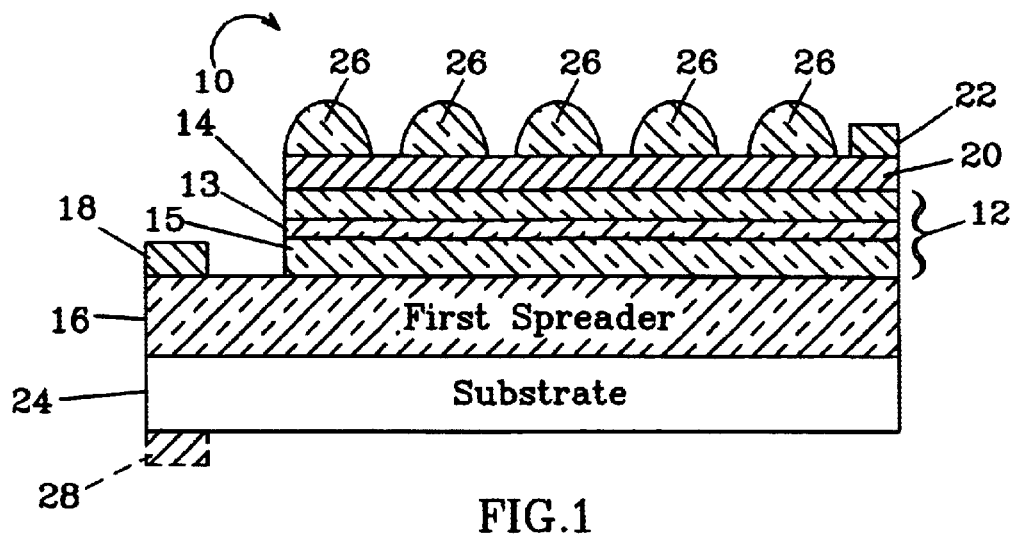
FIG. 1 is a sectional view of a new LED with an LEE array on the second spreader layer.

FIG. 1 shows one embodiment of the new LED 10 constructed in accordance with the present invention. The new LED has a LED structure 12 which consists of a active layer 13 sandwiched between two oppositely doped layers 14,15. In the preferred LED structure 12, the top layer 14 is p-type and the bottom layer 15 is n-type, although opposite doping in the layers 14,15 will also work. The new LED has a first spreading layer 16 that is made of a conductive material which spreads current from a first contact pad 18 to the LED structure's bottom layer 15. The first contact pad 18 is also referred to as the n-contact pad because in the preferred embodiment the bottom layer 15 is n-type. A second spreading layer 20 of conducting material is also included on the LED structure's top layer 14 to spread current from a second contact 22 to the top layer 14. The second contact 22 is also referred to as the p-contact because in the preferred LED structure 12 the top layer 14 is p-type. The LED structure, spreading layers and contacts are formed on a substrate 24 with the first spreading layer adjacent to the substrate 24.

The substrate 24 can be made of many materials and can be electrically conductive. When conductive, the substrate 24 can serve as the first spreader and an n-contact 28 can be deposited directly on the substrate. Current will spread through the substrate 24 to the bottom layer of the LED structure 12.

An array of surface LEEs 26 are formed by standard semiconductor processing techniques on the second spreading layer 20. The LEEs 26 provide surfaces for normally trapped TIR light to pass through or refract and escape, thereby increasing the efficiency of the LED 10. To increase their effectiveness, the LEEs 26 should have a higher index of refraction (n2) than the LED encapsulating material (n1). The higher n2 allows more light to enter the LEEs the would normally enter the encapsulating material. The shaped surfaces of the LEEs then allow more light to escape into the encapsulating material. One advantage of the new LED 10 is easy to manufacture because the LEEs can be formed by standard process techniques on a wafer of LEDs before they are separated.

The new LED 10 is preferably made from AlInGaN materials. The second spreader 20 is preferably a thin semi-transparent metal such as Pd, Pt, Pd/Au, Pt/Au, Ni/Au, NiO/Au or any alloy thereof deposited on the LED structure's top layer 14, which is preferably p-type AlInGaN. The second spreader 20 can be deposited on the new LED 10 by many conventional methods with the preferred methods being evaporation or sputtering. The first spreader 16 is preferably made of n-type AlInGaN and can be exposed for contact by reactive ion etching. Ni, Al/Ni/Au, Al/Ti/Au, or Al/Pt/Au is used as the n-contact 18 or 28 to the substrate 24 or first spreader 16.

Sapphire, AlN, SiC, or GaN can be used as the substrate 24, with SiC and GaN being conductive and AlN and sapphire being insulating. SiC has a much closer crystal lattice match to Group III nitrides such as GaN and results in Group III nitride films of high quality. Silicon carbide also has a very high thermal conductivity so that the total output power of Group III nitride devices on silicon carbide is not limited by the thermal dissipation of the substrate (as is the case with some devices formed on sapphire). SiC substrates are available from Cree Research, Inc., of Durham, N.C. and methods for producing them are set forth in the scientific literature as well as in a U.S. Pat. Nos. Re. 34,861; 4,946, 547; and 5,200,022.

The LEEs 26 are preferably formed on the device using the following method. The LEE material is deposited on the surface by evaporation, chemical vapor deposition (CVD), or sputtering. The preferred LEE materials are SiC, $SiN_x$, AlN, $SiO_xN_y$, $Si_3N_4$, ZnSe, $TiO_2$, $Ta_2O_5$, GaN, or SiO, with ZnSe, $TiO_2$, $SiN_x$, AlN, and GaN being most preferable. The preferred LEE thickness is in the range of 100 nm to 10 μm. After the LEE material is deposited, a photosensitive polymer, such as photoresist, is first exposed and developed as a mask.

The LEEs 26 can then be formed in the LEE material in two ways. First, the LEE material can be etched away through the mask with a wet chemical etch. This etch will undercut the mask layer to form the LEE structures. Second, the mask can be reflowed in an oven to form curved or linear grade in the mask. Reactive ion etching is then used to transfer the pattern from the mask into the LEE material, forming the final LEE structures. The array patterns can be regular or irregular in nature, with preferred distances between individual LEEs in the range of 1 μm to 50 μm.

Other methods can also be used to form the LEE structures and this technique is applicable to all LED material systems. Also, the LEE formation described can be used in any of the following embodiments where LEE arrays are formed.

Second Embodiment

Figure 2:
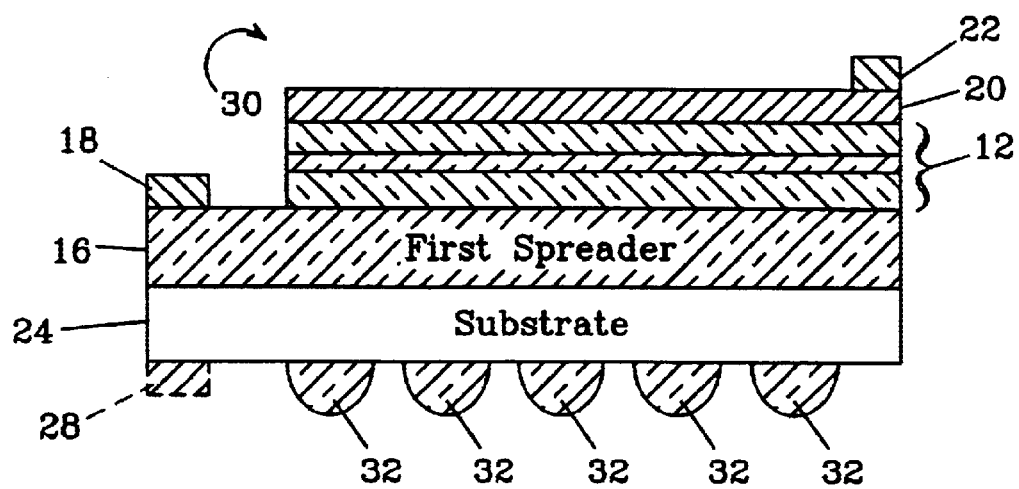
FIG. 2 is a sectional view of a new LED with an LEE array on the substrate's surface.

FIG. 2 shows a second embodiment of a new LED 30 constructed in accordance with the present invention. It is similar to the LED 10 in FIG. 1, having the same LED structure 12, first spreader 16, substrate 24, second spreader 20 and n- and p-contact pads 18, 22. It can also have the n-contact 28 on the substrate 24 when the substrate is conductive.

However, in this embodiment the LEEs 32 are formed on the surface of the substrate 24 opposite the first spreader 16. Like the LED 10, the LEEs 32 are formed during or after the fabrication of the devices, but before the die separation. To enhance the light extraction, the index of refraction (n2) of the LEEs should be larger than the index (n1) of the encapsulating material for the LEEs. The preferred materials and manufacturing processes used for the new LED 10 in FIG. 1, can also be used in this embodiment.

Alternatively, the LEEs 32 can be formed in the substrate 24. This is particularly applicable to SiC substrates with AlInGaN-based LED structures. The LEEs are formed directly in the substrate by reactive ion etching through an etch mask, or by cutting the substrate with a laser or saw. The depth of the LEEs in this case is preferably in the range of 1 $\mu$m to 200 $\mu$m and the distance between elements is preferably in the range of 1 $\mu$m to 200 $\mu$m.

This new LED 30 is particularly applicable to LEDs having a majority of the trapped light within the substrate region, such as the case for a GaN-based LED on a SiC substrate. By forming the LEEs 32 in an array, the new LEDs 10 and 30 have the advantage of being scalable to larger LED chip sizes as compared to the inverted truncated pyramid process disclosed by Krames, et al (see above).

Figure 3:
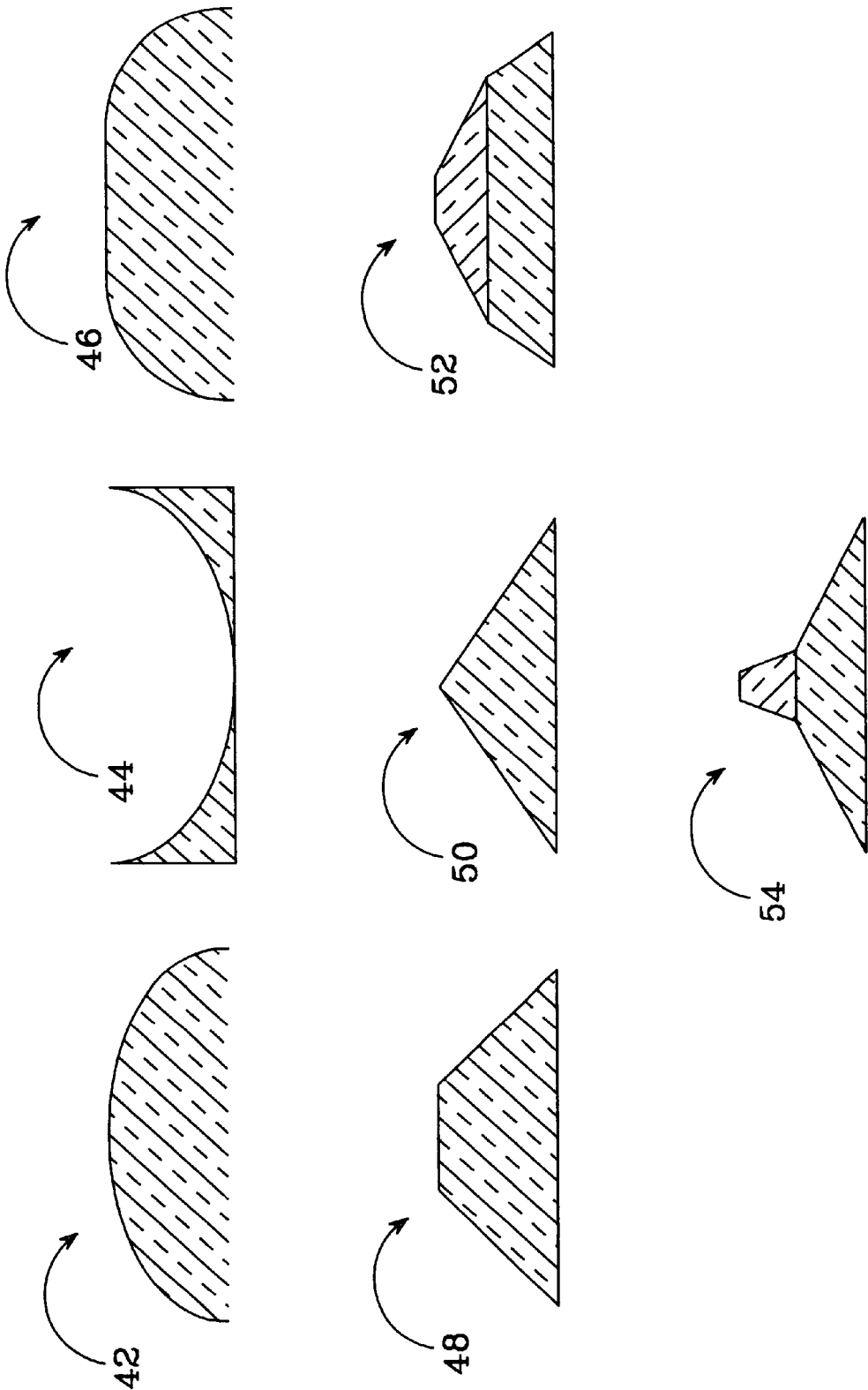
FIG. 3 shows sectional views of the basic shapes of LEEs that can be formed into arrays for integration with the new LEDs.

Different shapes can be used for all embodiments of the new LED to provide the best light extraction. FIG. 3 shows cross-sectional views of different examples of the shapes that can be used for the LEEs in the arrays. LEEs 42,44,46 have curved surfaces while LEEs 48,50,52,54 have piecewise linear surfaces. The shape can be chosen and adjusted to give the best light extraction for a given embodiment. The different shapes are formed by using different combinations of LEE materials and/or mask layers with standard wet chemical, dry etching, laser or wafer sawing techniques. The shapes shown in the figure represent only a small number of the possible shapes and the scope of this invention should not be limited to the shapes shown.

Third Embodiment

Figure 4:
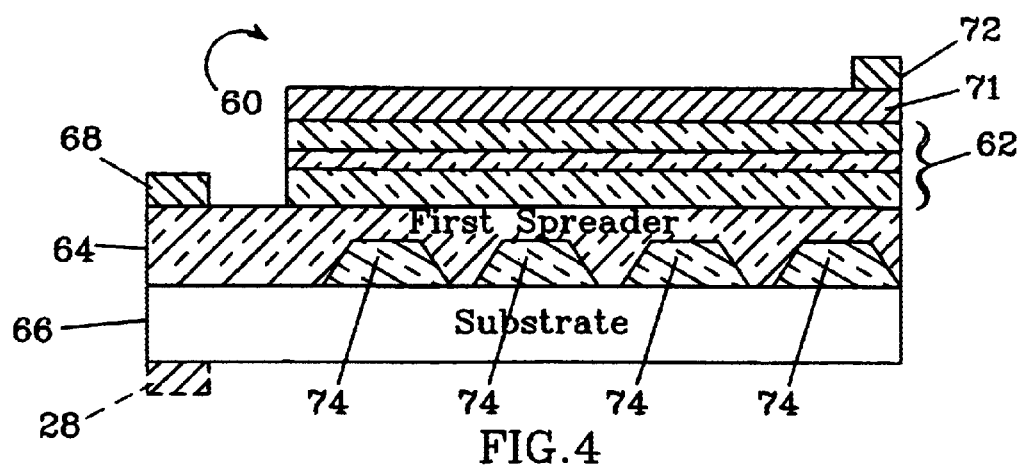
FIG. 4 is a sectional view of a new LED with an internal LEE array formed at the interface between the substrate and the first spreader layer.

FIG. 4 shows a third embodiment of the new LED 60 constructed in accordance with the present invention. It also has a LED structure 62, first spreader layer 64, substrate 66, n-contact 68, second spreader layer 71, and p-contact 72, all disposed similarly to those in LEDs 10 and 20. However, in this embodiment, the LEEs 74 are formed in an array that is internal to the LED device, preferably at the interface between the substrate 66 and first spreader 64. The LEE material must be of a different index of refraction, n2, than the second spreader material, n1, to provide reflections and refractions that can redirect normally trapped light into a direction that allows the light to escape from the LED 60.

The LEEs 74 are preferably formed using a photoresist mask with wet chemical etching of the LEE material. To form the internal LEE arrays, the epitaxial material must then be regrown over the LEEs. This is preferably done by metalorganic chemical vapor deposition (MOCVD), vapor phase epitaxy (VPE), or molecular beam epitaxy (MBE), with MOCVD being most preferable. The preferred mask materials are $SiO_2$, $SiN_2$, $Si_3N_4$, $TiO_2$, AlN, and SiO. The preferred thickness of LEE mask material is 0.1 $\mu$m to 10 $\mu$m and the preferred distance between LEEs is 1 $\mu$m to 50 $\mu$m. In addition, the internal LEEs may be placed at different locations within the LED structure.

Fourth and Fifth Embodiment

Figure 5:
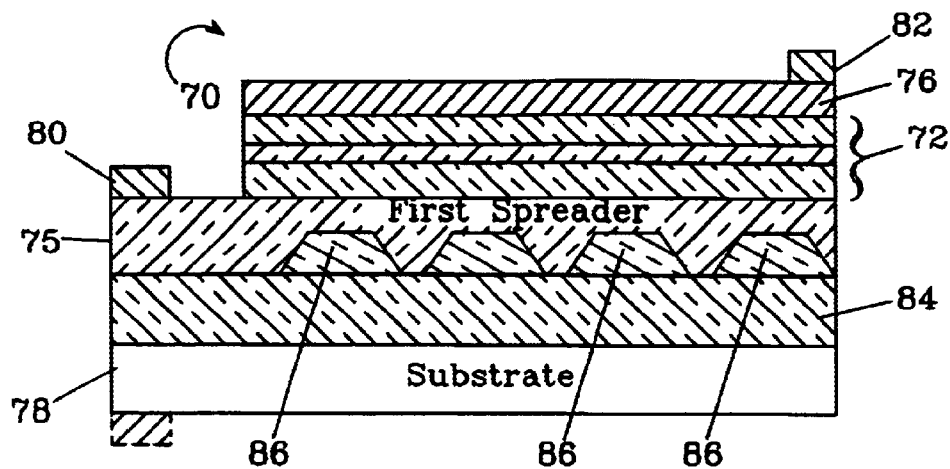
FIG. 5 is a sectional view of a new LED with an LEE array formed within the first spreader layer.

FIG. 5 shows a fourth embodiment of the new LED 70 constructed in accordance with the present invention. It has the same LED structure 72, spreader layers 75,76, substrate 78 and contacts 80,82 as the above embodiments. However, in this embodiment a layer of epitaxial material 84 is grown on the substrate before formation of the LEEs 86. The epitaxial layer 84 is grown by MOCVD, VPE, or MBE. The LEEs 86 are then formed in an array on the epitaxial layer's surface and the remainder of the second spreader 75 is formed over the LEEs 86. This embodiment can be used to facilitate the regrowth of the LED structure 76 over the LEE array, but requires one extra epitaxial growth step.

In GaN-based LEDs having LEEs within one of their layers, the regrowth over the LEE material can be accomplished by lateral epitaxial overgrowth (LEO) in an MOCVD growth system. This offers superior material quality over the standard planar growth, leading to a further increased LED emission as a side benefit to the light extraction.

Figure 6:
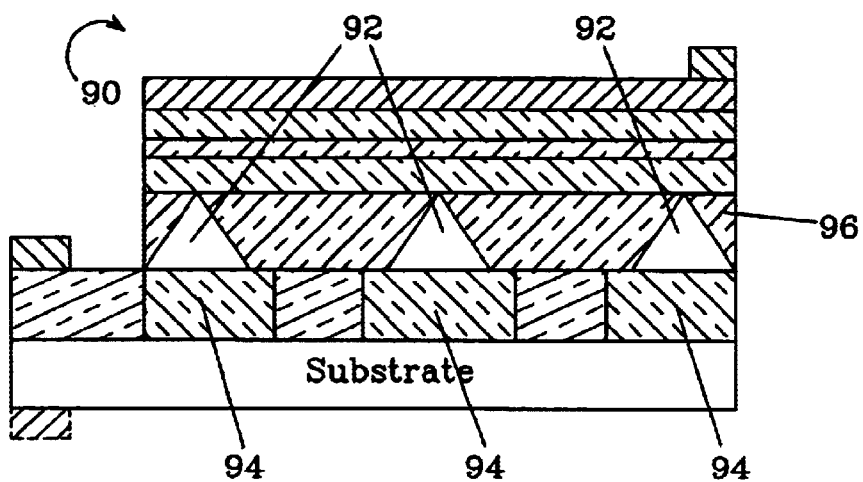
FIG. 6 is a sectional view of a new LED with an LEE array formed with voids.

In addition, the LEO process provides for another embodiment of the LED 90 constructed in accordance with this invention and shown in FIG. 6. In this embodiment, the LEO growth conditions are adjusted to create LEE voids 92 over the mask material 94. The voids 92 serve as linear (or curved) LEEs internal to the first spreader layer 96. The voids and the LEEs redirect the internally trapped light to enhance light extraction. The formation of voids in semiconductor material has been demonstrated by Fini. [See Fini et al., *High Quality Coalescence of Laterally Overgrown GaN Stripes on GaN/Sapphire Seed Layers*, Applied Physics Letters 75, 12, Pgs. 1706–1708 (1999)].

Sixth Embodiment

Figure 7:
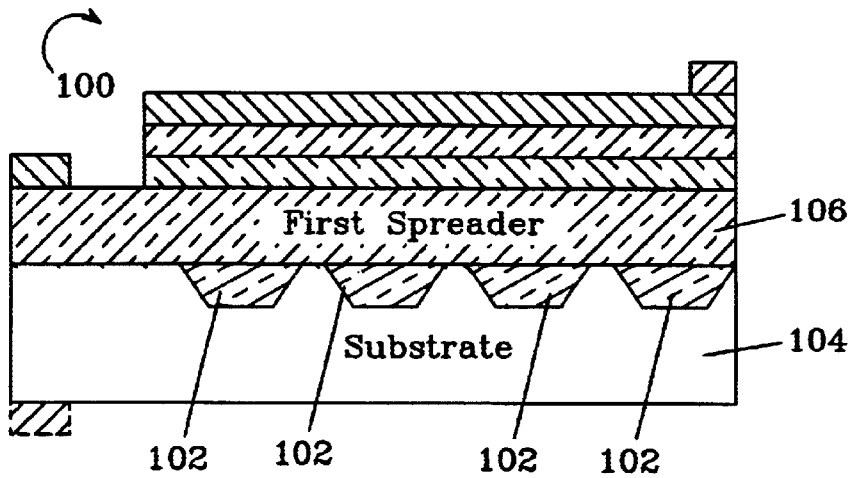
FIG. 7 is a sectional view of a new LED with an LEE array formed within the substrate at the interface with the first spreader layer.

FIG. 7 shows a sixth embodiment of the new LED 100 having the same layers as the above described LEDs. In this embodiment, the LEEs 102 are placed in an array at the interface between the substrate 104 and the first spreader 106, but within the substrate 104. The LEEs 102 are formed directly into the substrate 104 by etching the substrate through a mask with wet chemical or dry etching techniques. The LEEs are then grown in the etched areas and the remaining layers of the LED are grown over the LEEs by MOCVD, VPE, or MBE. The LEEs may be voids left in the substrate after regrowth of the epitaxial material or epitaxial material filled into the etched regions.

Seventh Embodiment

Figure 8:
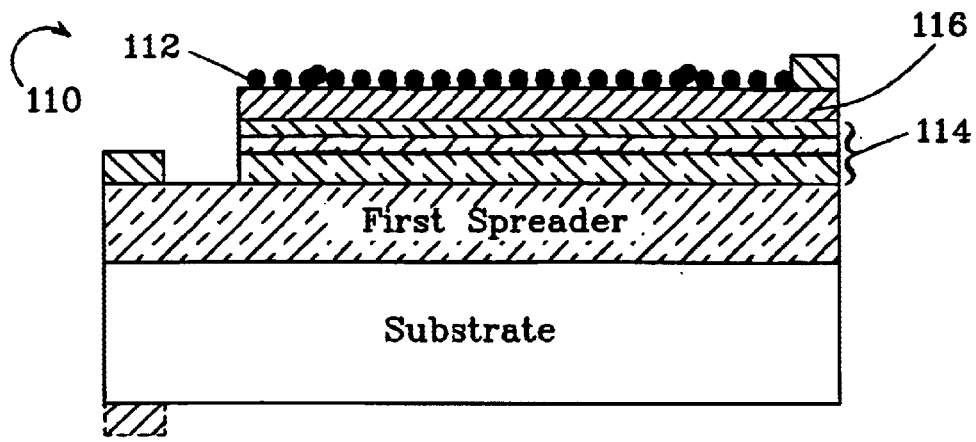
FIG. 8 is a sectional view of a new LED with a surface disperser layer formed on the second spreader layer.

FIG. 8 shows the seventh embodiment of the new LED 110, using a disperser layer 112 on top of the epitaxial side of the LED structure 114, and on top of the second current spreading layer 116. Again, the substrate, LED layers, and LED contacts are the same type as described in earlier embodiments. To be most effective, the disperser layer should have an index of refraction, n2, larger than the LED encapsulation material, n1. In general, the higher the index of refraction, n2, the better the light extraction. The disperser layer particles should have distances of 20 $\mu$m to 1 $\mu$m between adjacent particles. The particle size should be 20 nm to 1 $\mu$m. Alternatively, the disperser layer can be a series of holes in layer of material having a different index of refraction.

The disperser 112 can be formed by several different methods. The first method is to directly coat the surface of the LED structure with microspheres with the desired index of refraction. The preferred microspheres are ZnSe or $TiO_2$ or any high index, low optical absorption material. The LED can be coated by spraying or spin-coating spheres that are immersed in a solvent or water.

The second method of formation is to first deposit a disperser material uniformly or nearly uniformly over the LED's surface by evaporation, CVD, or sputtering. Preferred materials are SiN, AlN, ZnSe, TiO$_2$, and SiO. Next, a mask material is coated over the surface, with the preferred mask materials being silica or polystyrene microspheres, or a thin polymer layer such as a spin coated photoresist. The mask material is used as a mask for wet chemical etching of the disperser material or as an ablative mask for dry etching, such as RIE. After the transfer of the pattern to the disperser material, the remaining mask material is removed, leaving a disperser on the LED surface.

The embodiments presented here are improvements to the LED described and demonstrated by Schnitzer, et al. They offer the advantage of not having to etch the disperser layer into the semiconductor material. This enables disperser technology to be easily used with the GaN-based material system, where the first spreader material is typically a very thin metallic layer that cannot be easily interrupted.

Eight Embodiment

Figure 9:
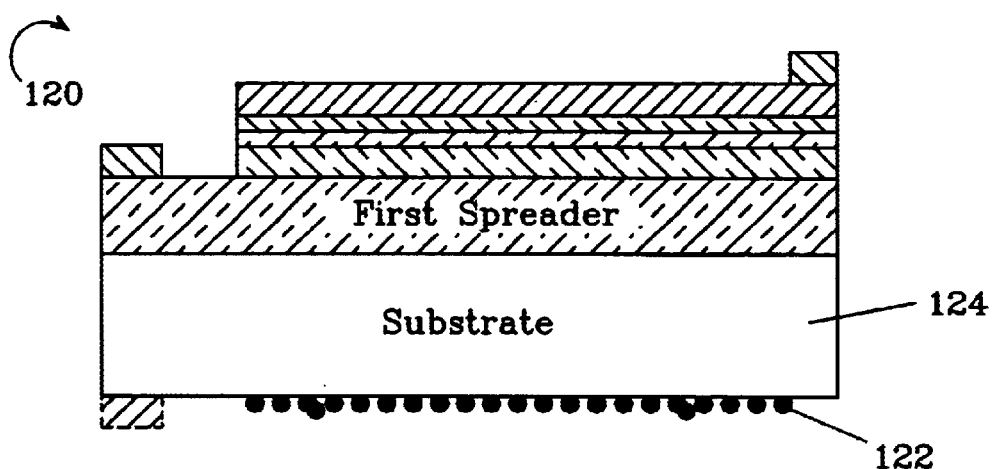
FIG. 9 is a sectional view of a new LED with a surface disperser layer formed on the substrate.

FIG. 9 shows a new LED 120 that is a variation of the LED 110 in FIG. 8. LED 120 has the same LED layers, but in this embodiment, the disperser layer 122 is applied to the bottom surface of the substrate 124. This approach is particularly applicable to LED where the index of refraction of the substrate is similar to the LED epitaxial layers, such as AlInGaN epitaxial layers on SiC.

Ninth and Tenth Embodiments

Figure 10:
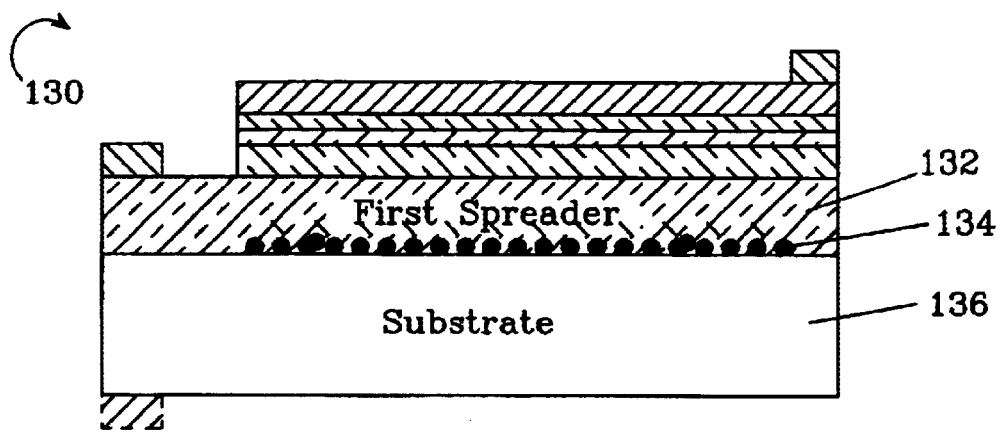
FIG. 10 is a sectional view of a new LED with an internal disperser layer formed within the first spreader at the interface with the substrate.
Figure 11:
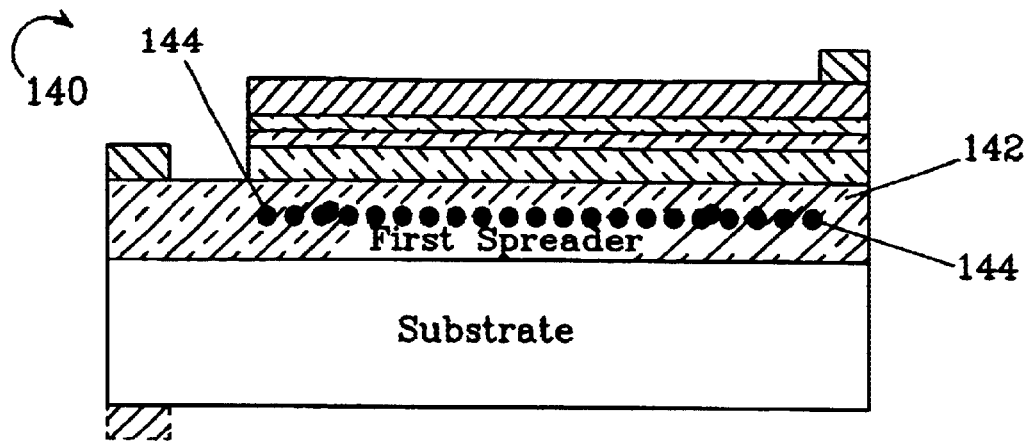
FIG. 11 is a sectional view of a new LED with an internal disperser layer formed within the first spreader layer.

FIGS. 10 and 11 show new LEDs 130 and 140, where their respective disperser layers 134, 144 are placed within their first spreader layer 132, 142. For these embodiments, the disperser layer index, n2, must differ from the first spreader layer's refractive index, n1, so that scattering of light can occur. The preferred material for this disperser layer is silica or TiO$_2$ microspheres.

For LED 130 in FIG. 10, the disperser layer 134 is disposed at the interface between the substrate 136 and the first spreader 132. The LED layers are then grown over the disperser layer by MOCVD, VPE, or MBE. For LED 140 in FIG. 11, the disperser layer 144 is within the first spreader layer 142. A layer of the first spreader is first grown and disperser layer 144 is then formed. The remainder of the first spreader and the LED layers are then grown over the disperser layer.

The disperser layer can also be formed within the other layers of the LEDs 130, 140, including the layers of the LED structures and the substrates. The disperser can also be formed by other methods and with other materials. Accordingly, this invention should not be limited to the placement of the disperser layers as shown.

Eleventh Embodiments

Figure 12:
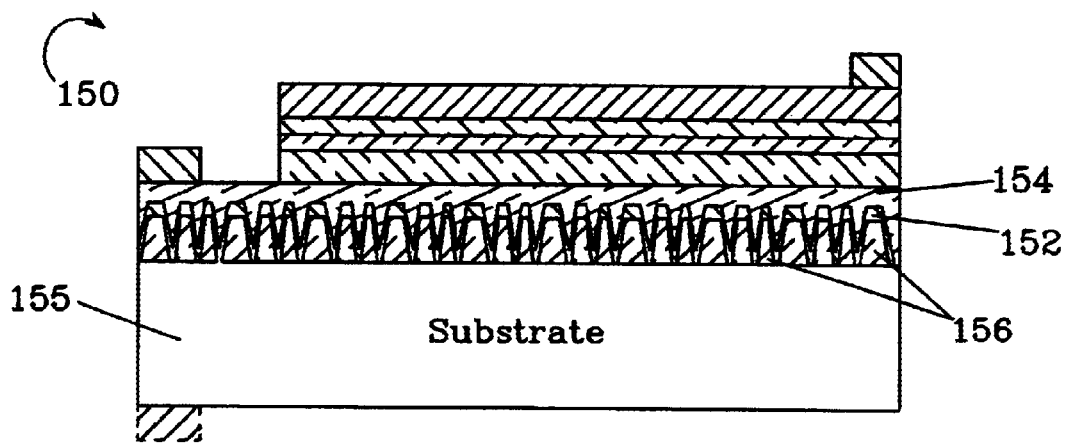
FIG. 12 shows a sectional view of a new LED where the internal disperser layer is formed in-situ during the epitaxial growth.
Figure 13:
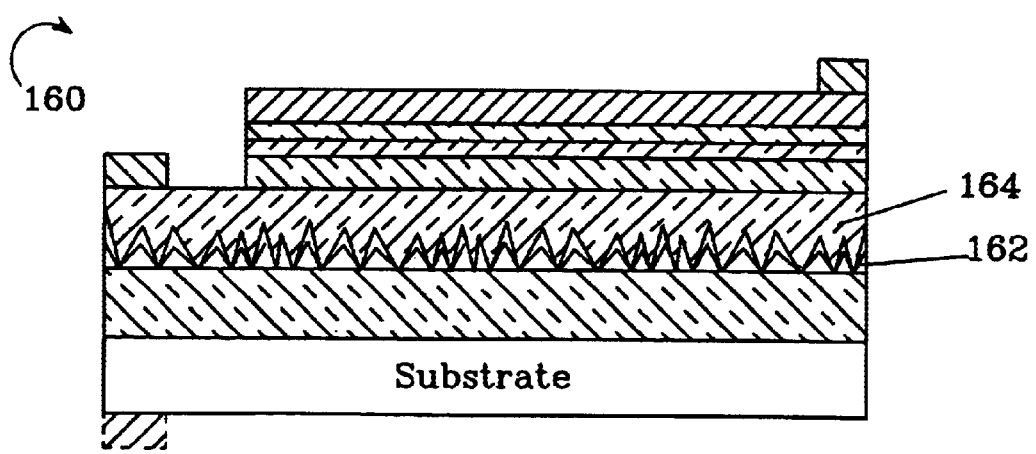
FIG. 13 also shows a sectional view of a new LED where the internal disperser layer is formed in-situ during the epitaxial growth.

Disperser layers can also be formed in LEDs using in-situ techniques when MOCVD is used as the epitaxial growth tool. This technique is particularly applicable to GaN based LEDs. FIGS. 12 and 13 show two LEDs 150 and 160 having disperser layers 152, 162 formed in-situ in the first spreader layers 154, 164. In LED 150, its substrate 155 is made of SiC or sapphire, and the first spreader 154 is formed of uncoalesced islands of material made of Al$_x$In$_y$Ga$_{1-x-y}$N, $0 \leq x \leq 1$, $0 \leq y \leq 1$. During the initial stages of the first spreader's growth, islands 156 are formed. Prior to coalescence of the islands 156, growth is stopped and a layer 152 of lower index of refraction material, such as AlGaN, SiO$_2$, or SiN, is deposited over and/or in between the islands, creating the required internal index discontinuities. Growth then proceeds as normal to finish the first spreader layer and the LED structure.

For the LED 160, instead of using islands to form the discontinuities, growth conditions can be changed during the initial stages of the first spreader layer's growth, to introduce a roughness on its surface. For AlInGaN based LEDs the epitaxial layers can be grown rough by increasing the flow of disiline, changing the flow of ammonia, or increasing the rate that said first layer is grown. Once roughness is introduced, lower index of refraction AlGaN or other dielectric layer 162 is deposited. Growth then proceeds as normal to finish the first spreader and the LED structure.

Just as above, the disperser layers described can be placed in other layers including the LED structure's layers and the substrate, and the invention should not be limited to the placements shown.

Flip-chip Embodiments

Figure 14:
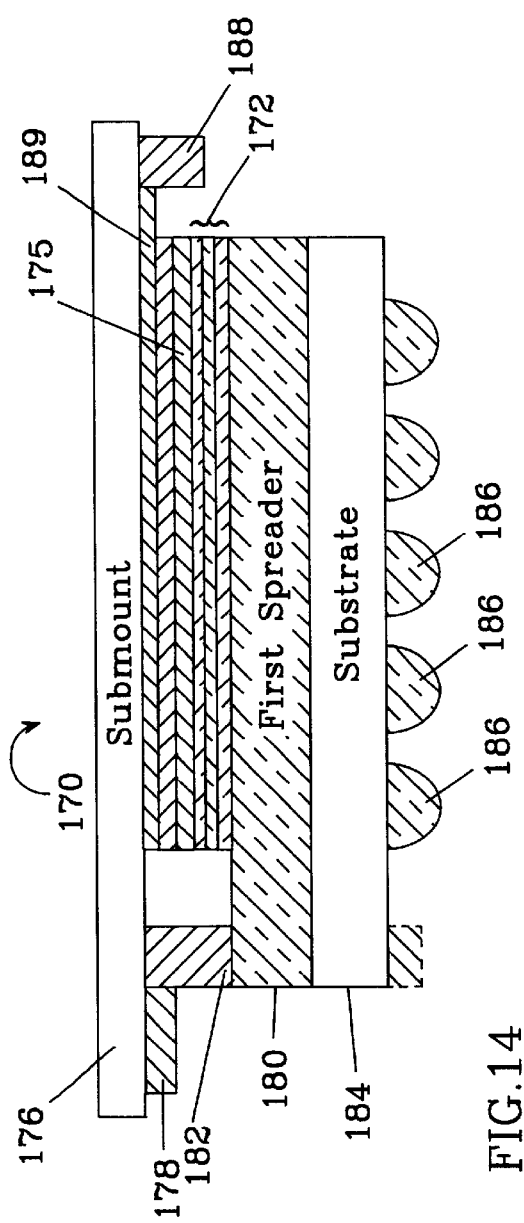
FIG. 14 is a sectional view of a new flip-chip mounted LED with an LEE array on the substrate's surface.

Finally, in all embodiments listed above, the devices can be mounted using flip-chip bonding techniques. FIG. 14 shows a new LED 170 bonded in such a configuration. The LED structure 172 is coated with a conductive reflective layer 175 and a second spreader layer 189 is affixed to the reflective layer 175 by a conductive bonding media. A submount 176 is then mounted on the second spreader layer 189. A p-contact 188 is included on a submount 176 and is bonded to the second spreader layer 189. Current applied to the p-contact 188 spreads into the second spreader layer and into the LED structure's top layer.

An n-contact layer 178 is also included on the submount 176 and is coupled to the first spreader layer 180 through a second conductive bonding layer 182. Current from the n-contact 178 passes through the layer 182 to the first spreader 180 and into the LED structure's bottom layer. LEEs 186 are formed on the bottom surface of substrate 184.

Light emits from LED 170 primarily through its substrate 184 and light extraction from this structure can be improved over the conventional bonding structures, depending on the type of LEE array or disperser used. Here, the redirected light can escape the chip on the first pass through the LEEs 186, reducing any chance of optical loss of light having to come back through the substrate after being redirected.

Figure 15:
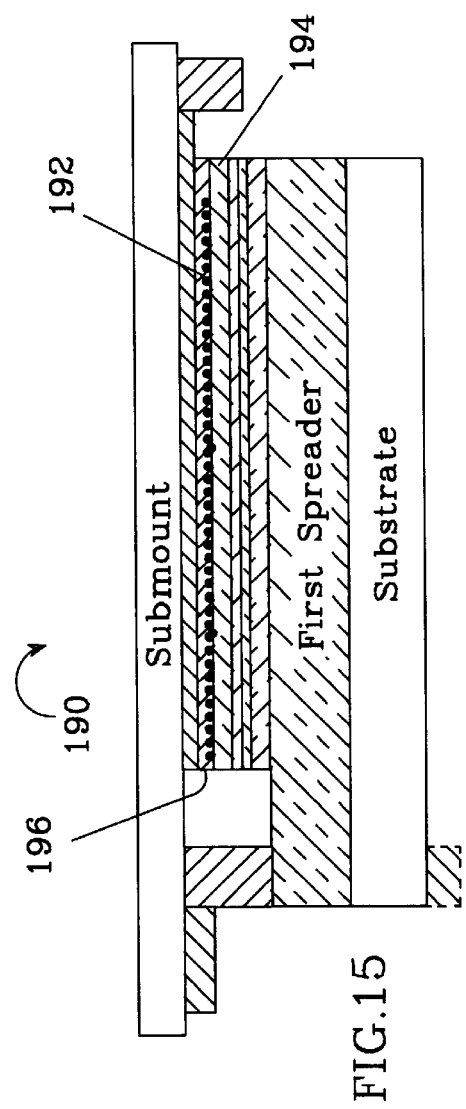
FIG. 15 is a sectional view of a new flip-chip mounted LED with a surface disperser layer formed within one of the LED's layers.

FIG. 15 shows a new LED 190, using flip-chip bonding similar to LED 170. However, instead of utilizing LEEs it has a disperser layer 192 at the interface of the second spreader 194 and the reflective layer 196.

Although the present invention has been described in considerable detail with reference to certain preferred embodiments thereof, other versions are possible. Other LED configurations utilizing the LEE arrays can also be envisioned by one skilled in the art. The new LED can have different combinations of LEE arrays and disperser layer. LEEs can have different shapes, sizes, spaces between adjacent LEE, and can be placed in different locations. Similarly, the disperser layers can be made of different material and placed in different location. Therefore, the spirit and scope of the appended claims should not be limited to the preferred embodiments described above.

We claim:

1. A light emitting diode (LED) with enhanced light extraction structures, comprising:
   an LED structure having:
      an epitaxially grown p-type layer;
      an epitaxially grown n-type layer; and
      an epitaxially grown active layer between said p-type and n-type layers;
   a first spreader layer adjacent to said LED structure;
   a second spreader layer adjacent to said LED structure, opposite said first spreader layer; and light extraction structures disposed integral with said LED, said light extraction structures providing surfaces to allow light trapped within said LED to disperse, reflect and/or refract out of said LED.

2. The LED of claim 1, further comprising a substrate adjacent to said first spreader layer, opposite said LED structure.

3. The LED of claim 1, wherein said substrate is electrically conductive and serves as a spreader layer.

4. The LED of claim 1, wherein said light extraction structures are disposed in a plane parallel to said layers and substantially covering the area of said LED.

5. The LED of claim 4, wherein said light extraction structures comprise an array of light extraction elements.

6. The LED of claim 5, wherein said LEEs have curved surfaces.

7. The LED of claim 5, wherein said LEEs have piecewise linear surfaces.

8. The LED of claim 1, wherein said light extraction structures comprise a disperser layer.

9. The LED of claim 8, wherein said disperser layer comprises a layer of microspheres.

10. The LED of claim 9, said microspheres have a different index of refraction than said LED layers.

11. The LED of claim 8, wherein said disperser layer comprises a roughened layer of material within said LED.

12. The LED of claim 11, wherein said roughened layer has a different index of refraction than said LED.

13. The LED of claim 1, wherein said light extraction structures are disposed on said second spreader layer, opposite said LED structure.

14. The LED of claim 2, wherein said light extraction structures are disposed on the surface of said substrate, opposite said first spreader layer.

15. The LED of claim 1, wherein said light extraction structures are disposed internal to said LED.

16. The LED of claim 15, wherein said light extraction structures have a different index of refraction than said LED layers.

17. The LED of claim 2, wherein said light extraction structures are disposed on the interface between said substrate and said first spreader layer, said structures substantially within said first spreader layer.

18. The LED of claim 2, wherein said light extraction structures are disposed within said first spreader layer.

19. The LED of claim 2, wherein said light extraction structures are disposed on the interface between said substrate and said first spreader layer, said structures substantially within said substrate.

20. The LED of claim 1, further comprising a first contact on said first spreader layer and a second contact on said second spreader layer, a bias applied across said contacts causing said LED to emit light.

21. The LED of claim 2, wherein said substrate is conductive and said LED further comprises a first contact on said substrate and a second contact on said second spreader layer, a bias applied across said contacts causing said active layer to emit light.

22. The light emitting diode of claim 2, further comprising:
a submount;
a reflective layer disposed on said LED structure; and
a second spreader layer on said submount and affixed to said reflective layer opposite said LED structure;
a bias applied across said first and second conductive layers causing said active layer to emit light, said substrate being the primary emission surface.

23. A light emitting diode with enhanced light extraction, comprising
a p-type layer;
an n-type layer;
an active layer between said p-type and n-type layers wherein either said p-type or n-type layer is a top layer and the other said layer is a bottom layer;
a first spreader layer adjacent to said bottom layer;
a second spreader layer on said top layer;
respective electrical contacts on said spreader layers so that a bias applied across said contacts causes said active layer to emit light;
a substrate adjacent to said first spreader layer; and
light extraction structures integral with said layers, running parallel to said layers and substantially covering said LED, said light extraction structures providing surfaces to allow light trapped within said LED to disperse, reflect and/or refract out of said LED.

24. The LED of claim 23, wherein said light extraction structures comprise an array of light extraction elements (LEEs) having curved or piecewise linear surfaces.

25. The LED of claim 23, wherein said light extraction structures comprise a disperser layer.

26. The LED of claim 25, wherein said disperser layer comprises a roughened layer of material within said LED.

27. The LED of claim 23, wherein said light extraction structures are disposed on said second spreader layer, opposite said top layer.

28. The LED of claim 23, wherein said light extraction structures are disposed on the surface of said substrate, opposite said first spreader layer.

29. The LED of claim 23, wherein said light extraction structures are disposed internal to said LED layers.

30. The LED of claim 23, wherein said light extraction structures are disposed on the interface between said substrate and said first spreader layer, said structures substantially within said first spreader layer.

31. The LED of claim 23, wherein said light extraction structures are disposed within said first spreader layer.

32. The LED of claim 23, wherein said light extraction structures are disposed on the interface between said substrate and said first spreader layer, said structures substantially within said substrate.

33. A light emitting diode (LED) with enhanced light extraction, comprising:
an LED structure having:
an epitaxially grown p-type layer;
an epitaxially grown n-type layer; and
an epitaxially grown active layer between said p-type and n-type layers;
a reflective layer deposited on said LED structure;
a second spreader layer on said reflective layer;
a submount on said second spreader layer;
a first spreader layer adjacent said LED structure, opposite said reflective layer;
a bias applied across said first and second spreader layers causing said active layer to emit light, said substrate becoming the primary light emission surface; and
light extraction structures integral with said LED, said light extraction structures running parallel to said LED structure and substantially covering the area of said LED.

34. The LED of claim 33, wherein said light extraction structures comprise an array of light extraction elements (LEEs) having curved or piecewise linear surfaces.

35. The. LED of claim 33, wherein said light extraction structures comprise a disperser layer.

36. The LED of claim 33, further comprising a p-contact on said submount and adjacent to said second spreader, a conductive media between said submount and said first spreader layer, and an n-contact on said submount and adjacent said conducting media, a bias applied across said p- and n-contacts causing said LED structure to emit light.

* * * * *